(12) United States Patent
Vincent et al.

(10) Patent No.: US 11,133,273 B2
(45) Date of Patent: Sep. 28, 2021

(54) SEMICONDUCTOR DEVICE WITH WAVEGUIDE AND METHOD THEREFOR

(71) Applicant: NXP USA, INC., Austin, TX (US)

(72) Inventors: Michael B. Vincent, Chandler, AZ (US); Giorgio Carluccio, Eindhoven (NL); Maristella Spella, Eindhoven (NL); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 61 days.

(21) Appl. No.: 16/716,680

(22) Filed: Dec. 17, 2019

(65) Prior Publication Data

US 2021/0183796 A1 Jun. 17, 2021

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 1/2283* (2013.01);
(Continued)

(58) Field of Classification Search
CPC . H01L 23/66; H01L 21/4853; H01L 21/4857; H01L 21/565; H01L 21/568; H01L 21/6835; H01L 23/3128; H01L 23/5383; H01L 23/5386; H01L 23/5389; H01L 24/19; H01L 24/20; H01L 2221/68372; H01L 2223/6627; H01L 2223/6677; H01L 2224/214; H01Q 1/2283; H01Q 21/064; H01Q 21/0087; H01Q 13/06
See application file for complete search history.

(56) References Cited

U.S. PATENT DOCUMENTS 9,136,230 B2  9/2015 Demin et al.
9,219,041 B2  12/2015 Elad et al.
(Continued)

OTHER PUBLICATIONS

U.S. Appl. No. 16/446,861, filed Jun. 20, 2019, and titled "Package Integrated Waveguide".
(Continued)

*Primary Examiner* — Kyoung Lee
*Assistant Examiner* — Christina A Sylvia

(57) ABSTRACT

A method of manufacturing a semiconductor device is provided. The method includes forming an assembly including placing a semiconductor die and a launcher structure on a carrier substrate, encapsulating at least a portion of the semiconductor die and the launcher structure, and applying a redistribution layer on a surface of the semiconductor die and a surface of the launcher structure to connect a bond pad of the semiconductor die with an antenna launcher of the launcher structure. The assembly is attached to a substrate and a waveguide overlapping the assembly is attached to the substrate. The waveguide structure is physically decoupled from the assembly.

11 Claims, 16 Drawing Sheets

(51) Int. Cl.
*H01L 21/56* (2006.01)
*H01L 21/683* (2006.01)
*H01L 23/31* (2006.01)
*H01L 23/538* (2006.01)
*H01L 23/00* (2006.01)
*H01Q 1/22* (2006.01)

(52) U.S. Cl.
CPC ............ *H01L 2221/68372* (2013.01); *H01L 2223/6627* (2013.01); *H01L 2223/6677* (2013.01); *H01L 2224/214* (2013.01)

(56) References Cited

U.S. PATENT DOCUMENTS

| | | | |
|---|---|---|---|
| 10,056,922 B1* | 8/2018 | Tsvelykh | H01P 1/20345 |
| 10,103,447 B2 | 10/2018 | Tong et al. | |
| 10,460,987 B2* | 10/2019 | Liao | H01L 21/76837 |
| 10,651,541 B1* | 5/2020 | Hayes | H01Q 21/064 |
| 2007/0200748 A1* | 8/2007 | Hoegerl | H01L 23/3128 342/85 |
| 2014/0111394 A1* | 4/2014 | Seok | H05K 3/4644 343/772 |
| 2015/0229017 A1 | 8/2015 | Suzuki et al. | |
| 2016/0043455 A1 | 2/2016 | Seler et al. | |
| 2017/0033062 A1* | 2/2017 | Liu | H01L 21/486 |
| 2017/0162524 A1* | 6/2017 | Wang | H01L 23/3128 |
| 2017/0324135 A1 | 11/2017 | Blech et al. | |
| 2019/0109362 A1 | 4/2019 | Haroun et al. | |
| 2019/0115643 A1 | 4/2019 | Khan et al. | |
| 2019/0348746 A1 | 11/2019 | Gupta et al. | |
| 2020/0365971 A1 | 11/2020 | Moallem et al. | |
| 2020/0403298 A1* | 12/2020 | Vincent | H01L 24/16 |
| 2021/0066219 A1* | 3/2021 | Chen | H01L 21/4857 |

OTHER PUBLICATIONS

U.S. Appl. No. 16/287,226, filed Feb. 27, 2019, and titled "Package Integrated Waveguide".

U.S. Appl. No. 16/524,596, filed Jul. 29, 2019, and titled "Method, System, and Apparatus for Forming Three-Dimensional Semiconductor Device Package With Waveguide".

\* cited by examiner

US 11,133,273 B2

SEMICONDUCTOR DEVICE WITH WAVEGUIDE AND METHOD THEREFOR

BACKGROUND

Field

This disclosure relates generally to semiconductor device packaging, and more specifically, to a semiconductor device with waveguide and method of forming the same.

Related Art

Today, there is an increasing trend to include radar systems in vehicles such as automobiles, trucks, buses, and the like in order to provide a driver with enhanced awareness of objects around the driver's vehicle. As the vehicle approaches objects (e.g. other cars, pedestrians, and obstacles) or as objects approach the vehicle, a driver cannot always detect the object and perform intervention actions needed to avoid a collision with the object. An automotive radar system mounted on a vehicle can detect the presence of objects including other vehicles in proximity to the vehicle and provide the driver with timely information so that the driver can perform possible intervention actions. However, such automotive radar system can significantly impact the cost of the vehicle.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device including a packaged assembly with overlapping waveguide structure affixed to a common substrate. The waveguide structure is physically decoupled from the packaged assembly. A semiconductor die and launcher structure are encapsulated on a package substrate to form the packaged assembly. The waveguide structure includes a waveguide opening over an antenna launcher of the launcher structure allowing propagation of radio frequency (RF) signals. By having the overlapping waveguide structure physically decoupled from the packaged assembly, package stress is reduced and reliability is improved while providing low loss RF signal performance in a compact footprint.

Figure 1:
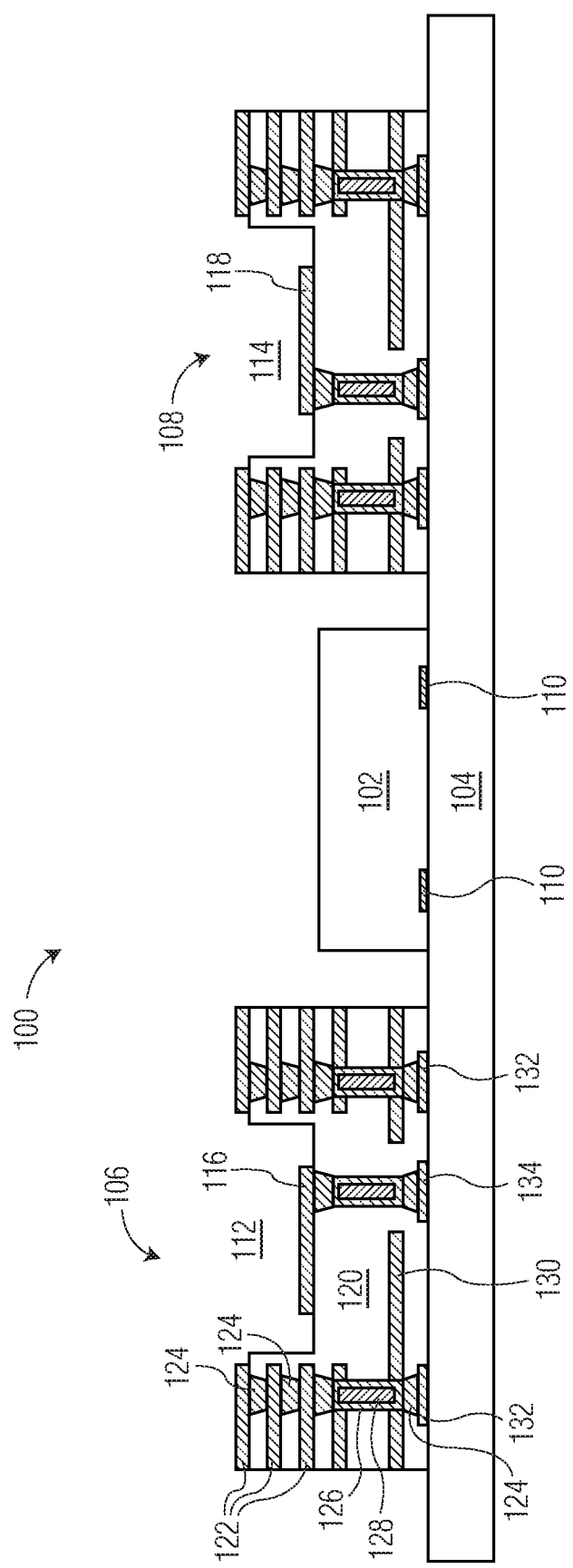
FIG. 1 through FIG. 4 illustrate, in a simplified cross-sectional view, an example semiconductor device with waveguide along line A-A of FIG. 5 at stages of manufacture in accordance with an embodiment.
Figure 5:
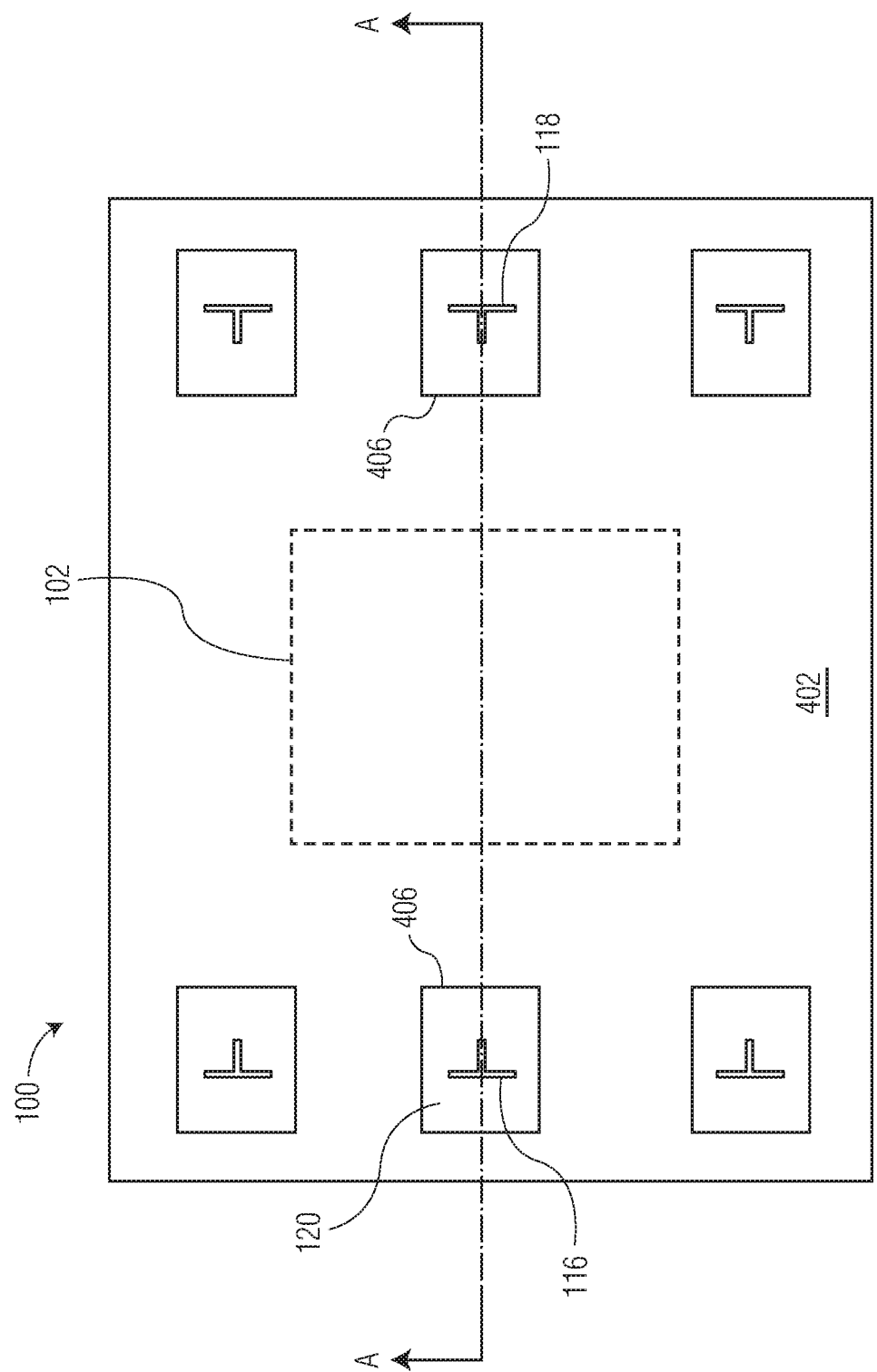
FIG. 5 illustrates, in a plan view, the example semiconductor device with waveguide at the stage of manufacture depicted in FIG. 4 in accordance with an embodiment.

FIG. 1 illustrates, in a simplified cross-sectional view, an example assembly of an example semiconductor device with waveguide 100 along line A-A of FIG. 5 at a stage of manufacture in accordance with an embodiment. At this stage of manufacture, the assembly of semiconductor device 100 includes a semiconductor die 102 and launcher structures 106 and 108 placed on a carrier substrate 104.

In this embodiment, the launcher structures 106 and 108 are each formed as a multilayer laminate structure having a cavity (e.g., cavities 112 and 114). For example, launcher structure 106 includes conductive layers 122 and 130 (e.g., metal or other conductive material layers) separated by a non-conductive material 120 (e.g., FR-4, ceramic). Contacts 124 and vias 126 provide conductive connections between terminal pads 132 at a bottom surface of launcher structure 106 and conductive layers 122 and 130. The cavity 112 includes an antenna launcher 116 located at a bottom surface of the cavity 112. Likewise, the cavity 114 includes an antenna launcher 118 located at a bottom surface of the cavity 114. The antenna launcher 116 is connected to terminal pad 134 at the bottom surface of launcher structure 106 by way of interconnecting contacts and via (e.g., contacts 124, via 126). Via plugs 128 may be incorporated in vias 126 to provide additional strength and rigidity. In this embodiment, conductive layers 122 and interconnecting contacts 124 are configured and arranged to serve as a conductive wall or fence substantially surrounding the antenna launcher 116. In some embodiments, it may be desirable to connect the conductive wall or fence to a ground supply terminal or other supply terminal. In this embodiment, conductive layer 130 is configured and arranged to serve as a signal reflector located below the antenna launcher 116 and substantially surrounding the via interconnecting the antenna launcher 116 with the terminal pad 134. In some embodiments, it may be desirable to form the signal reflector on a next conductive layer immediately below the antenna launcher 116.

The semiconductor die 102 has an active surface (e.g., major surface having circuitry) and a backside surface (e.g., major surface opposite of the active surface). The semiconductor die 102 includes bond pads 110 at the active surface configured for connection to antenna launchers 116 and 118 by way of a redistribution layer (RDL), for example. The semiconductor die 102 may be formed from any suitable semiconductor material, such as silicon, germanium, gallium arsenide, gallium nitride and the like. Semiconductor die 102 may further include any digital circuits, analog circuits, RF circuits, memory, signal processor, MEMS, sensors, the like, and combinations thereof.

Figure 2:
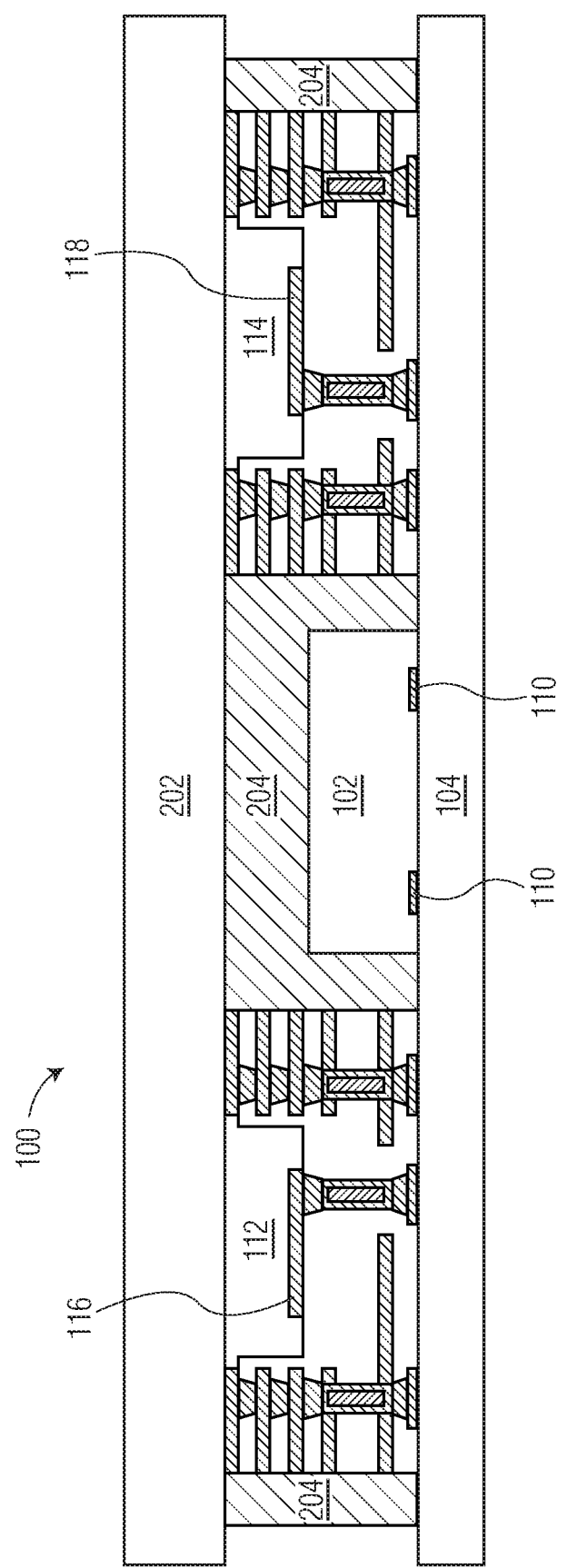

FIG. 2 illustrates, in a simplified cross-sectional view, the example assembly at a subsequent stage of manufacture in accordance with an embodiment. At this stage of manufacture, the assembly of semiconductor device 100 includes an encapsulant (e.g., epoxy material) 204 at least partially encapsulating semiconductor die 102 and launcher structures 106 and 108 placed on the carrier substrate 104. In this embodiment, the semiconductor die 102 and launcher structures 106 and 108 are over-molded with an epoxy material encapsulant by way of a film-assisted molding (FAM) process. A FAM tool 202 is in contact with a top surface of the launcher structures 106 and 108 while molding to keep predetermined portions (e.g., cavities 112 and 114) clear of encapsulant (e.g., not encapsulated).

Figure 3:
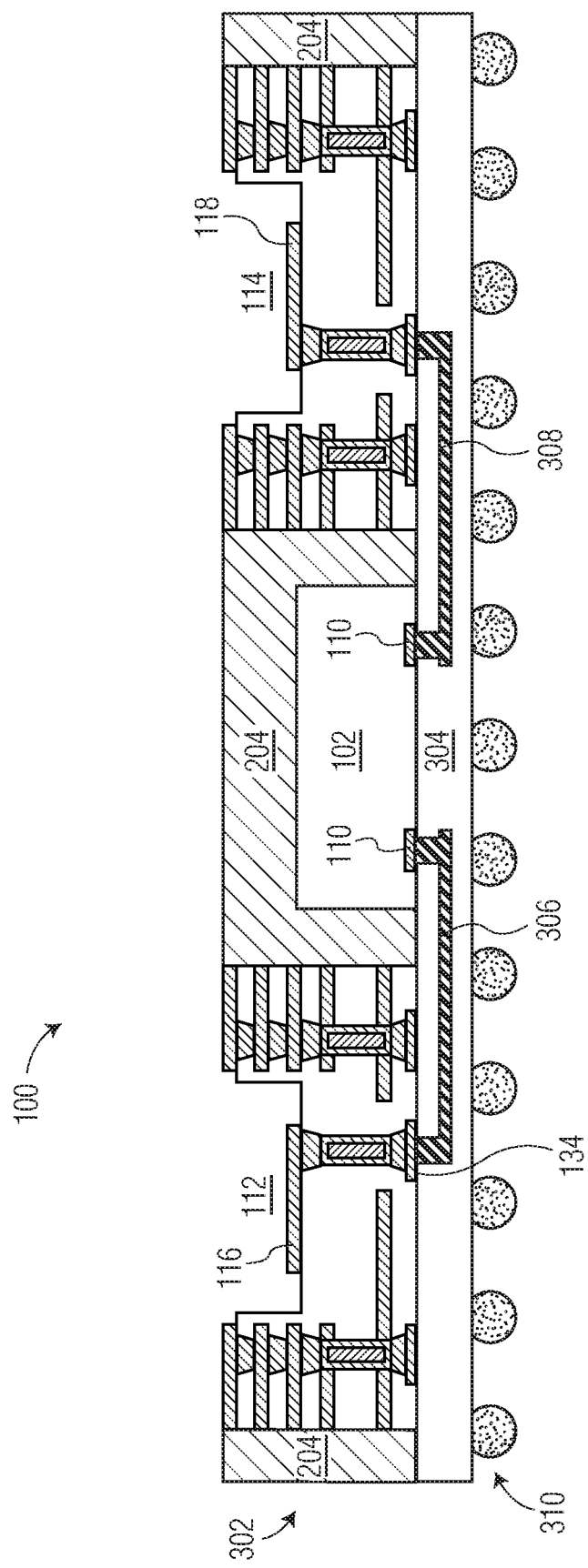

FIG. 3 illustrates, in a simplified cross-sectional view, the example assembly at a subsequent stage of manufacture in accordance with an embodiment. At this stage of manufacture, the assembly 302 includes an encapsulant 204 at least partially encapsulating semiconductor die 102 and launcher structures 106 and 108 along with an RDL substrate 304 and ball connectors 310. After the carrier substrate 104 is removed, the RDL substrate 304 is applied to the resulting exposed bottom surface including an exposed active surface of the semiconductor die 102 and exposed bottom surfaces of the launcher structures 106 and 108. Conductive feeds 306 and 308 are formed in the RDL substrate 304 between bond pads 110 and terminal pads 134 to interconnect semiconductor die 102 and antenna launchers 116 and 118 respectively. After the RDL substrate 304 is applied, conductive ball connectors 310 (e.g., solder balls) are affixed to a bottom surface of the RDL substrate 304. The ball connectors 310 are configured and arranged to provide conductive connections between the assembly 302 and a printed circuit board (PCB), for example. Ball connectors 310 may be any suitable conductive structure such as solder ball, gold studs, copper pillars, and the like, to connect conductive features of the assembly 302 with the PCB. In this embodiment, the RDL substrate 304 is formed as a build-up substrate including a redistribution layer. In some embodiments, the RDL substrate 304 may be formed as a pre-formed substrate including a redistribution layer. In other embodiments, ball connectors 310 may be directly affixed to terminal pads 132, 134 and bond pads 110 to provide connectivity with a PCB, for example, without utilizing an RDL substrate.

Figure 4:
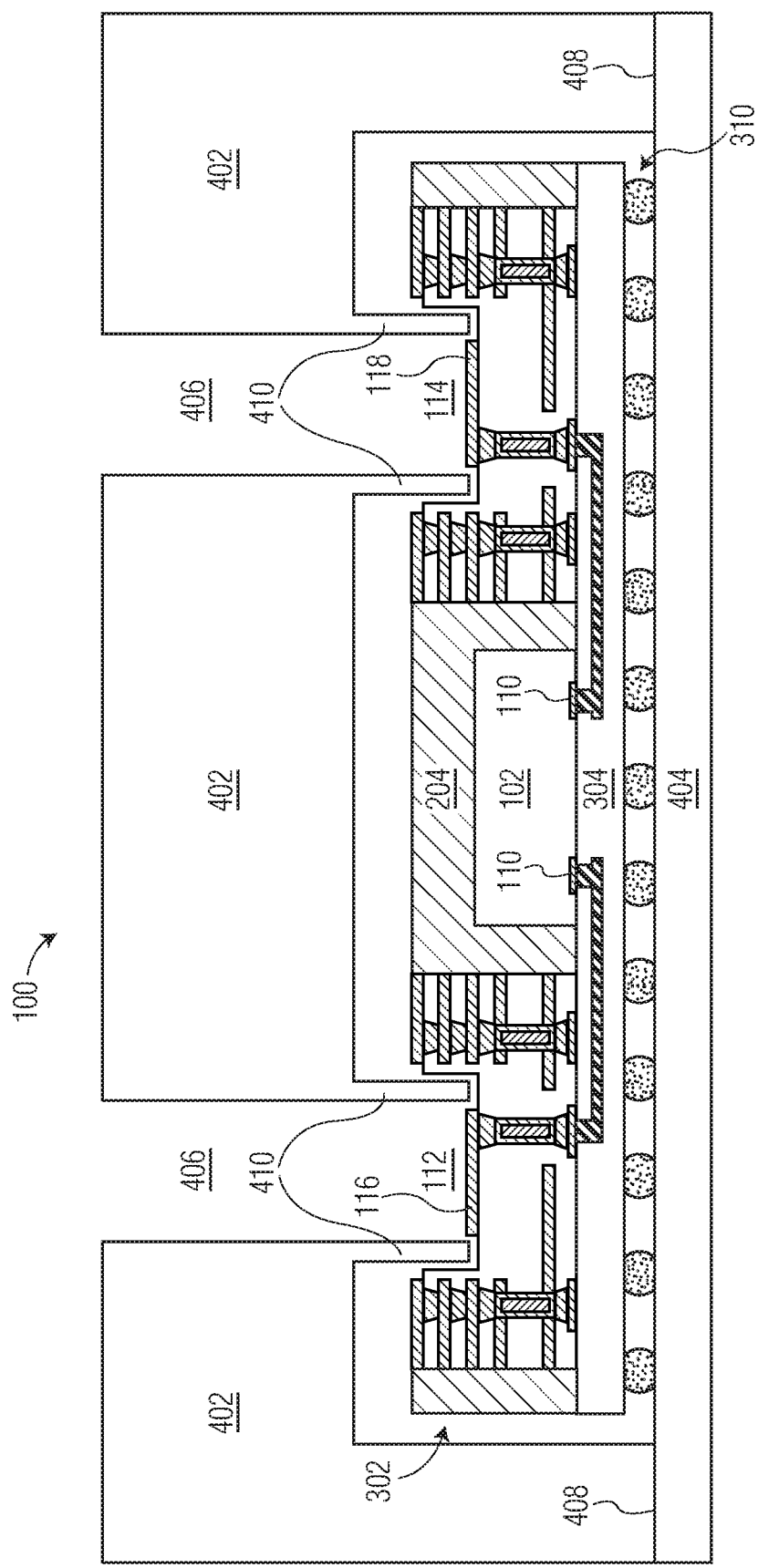

FIG. 4 illustrates, in a simplified cross-sectional view, the example semiconductor device with waveguide 100 along line A-A of FIG. 5 at a stage of manufacture in accordance with an embodiment. At this stage of manufacture, the semiconductor device 100 includes the assembly 302 and overlapping waveguide structure 402 affixed to a common substrate 404. With the assembly 302 and overlapping waveguide structure 402 affixed to the substrate 404, the waveguide structure 402 is physically decoupled from the assembly 302. For example, the waveguide structure 402 does not physically contact the assembly 302. In this embodiment, substrate 404 may be characterized as a PCB or other multilayer substrate configured to provide connectivity with other components of a system, for example.

The waveguide structure 402 includes waveguides 406 (e.g., waveguide openings) and is attached to the substrate 404 at interface surfaces 408. The waveguide structure 402 may be attached to the substrate 404 at interface surfaces 408 using screws, alignment pins, adhesives, and combinations thereof, for example. In this embodiment, the waveguide structure 402 is formed from a conductive material such as a metal (e.g., aluminum, copper), non-conductive material coated with conductive material, other conductive materials, or combinations thereof. Waveguides 406 are formed as waveguide openings in the waveguide structure 402 with antenna launchers 116 and 118 exposed through the openings. In this embodiment, the waveguide openings 406 include sidewall portions 410 which extend downward into the cavities 112 and 114 and substantially surrounding the antenna launchers 116 and 118 respectively. Waveguides 406 dimensions (e.g., width, length) may be configured for propagation of signals (e.g., radar, mmWave signals, 30 GHz to 300 GHz) having desired wavelengths. For example, a waveguide may be configured for propagation (e.g., transmission) of a radar signal having a frequency of 77 GHz. Because a 77 GHz signal has a wavelength of approximately 4 mm, the waveguide is configured having a width dimension of approximately 2 mm, or half of the desired wavelength.

FIG. 5 illustrates, in a plan view, the example semiconductor device with waveguide 100 at the stage of manufacture depicted in FIG. 4 in accordance with an embodiment. At this stage of manufacture, the semiconductor device 100 includes the assembly (302) and overlapping waveguide structure 402 affixed to a common substrate (404). Underlying semiconductor die 102 is shown as dashed outline labeled 102 for reference. Cross-sectional views of semiconductor device 100 taken along line A-A including waveguides 406 are shown in example stages of manufacture depicted in FIG. 1 through FIG. 4. Waveguides 406 are formed as waveguide openings in the waveguide structure 402 with antenna launchers 116 and 118 and non-conductive material 120 of launcher structures 106 and 108 exposed through the respective openings.

Figure 6:
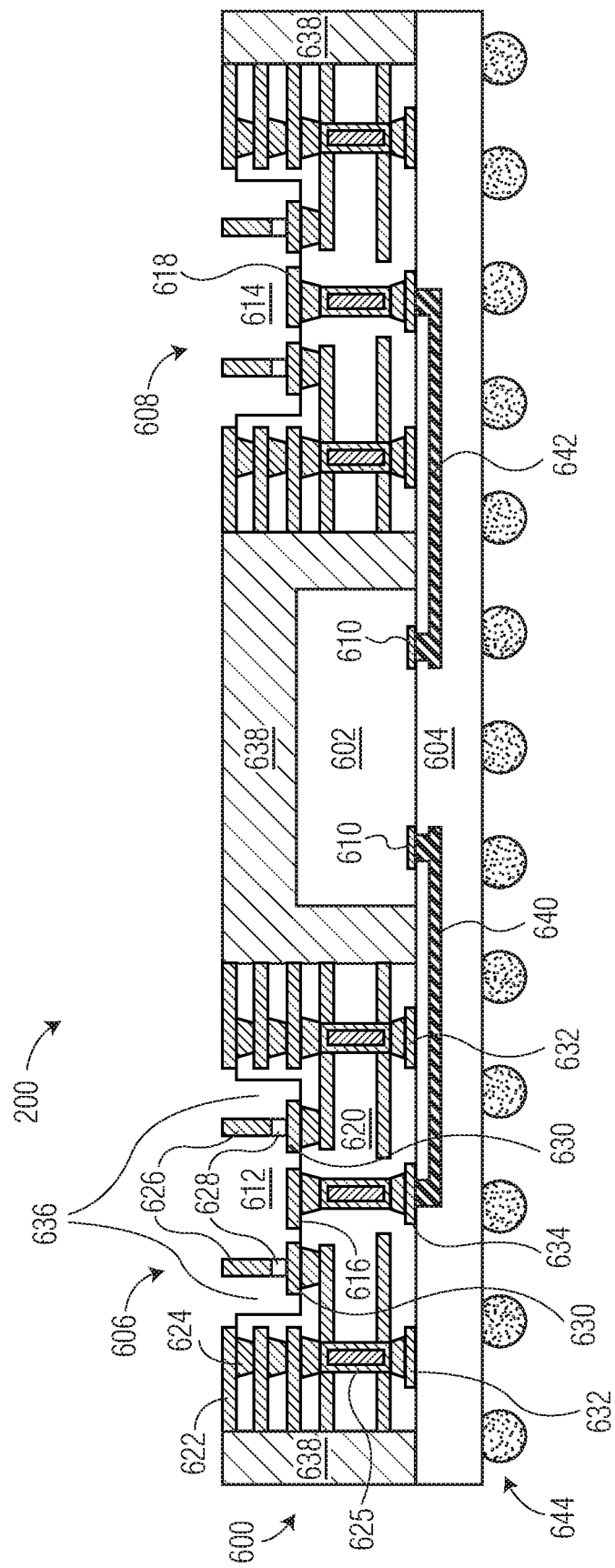
FIG. 6 and FIG. 7 illustrate, in a simplified cross-sectional view, an alternative example semiconductor device with waveguide along line B-B of FIG. 8 at stages of manufacture in accordance with an embodiment.
Figure 8:
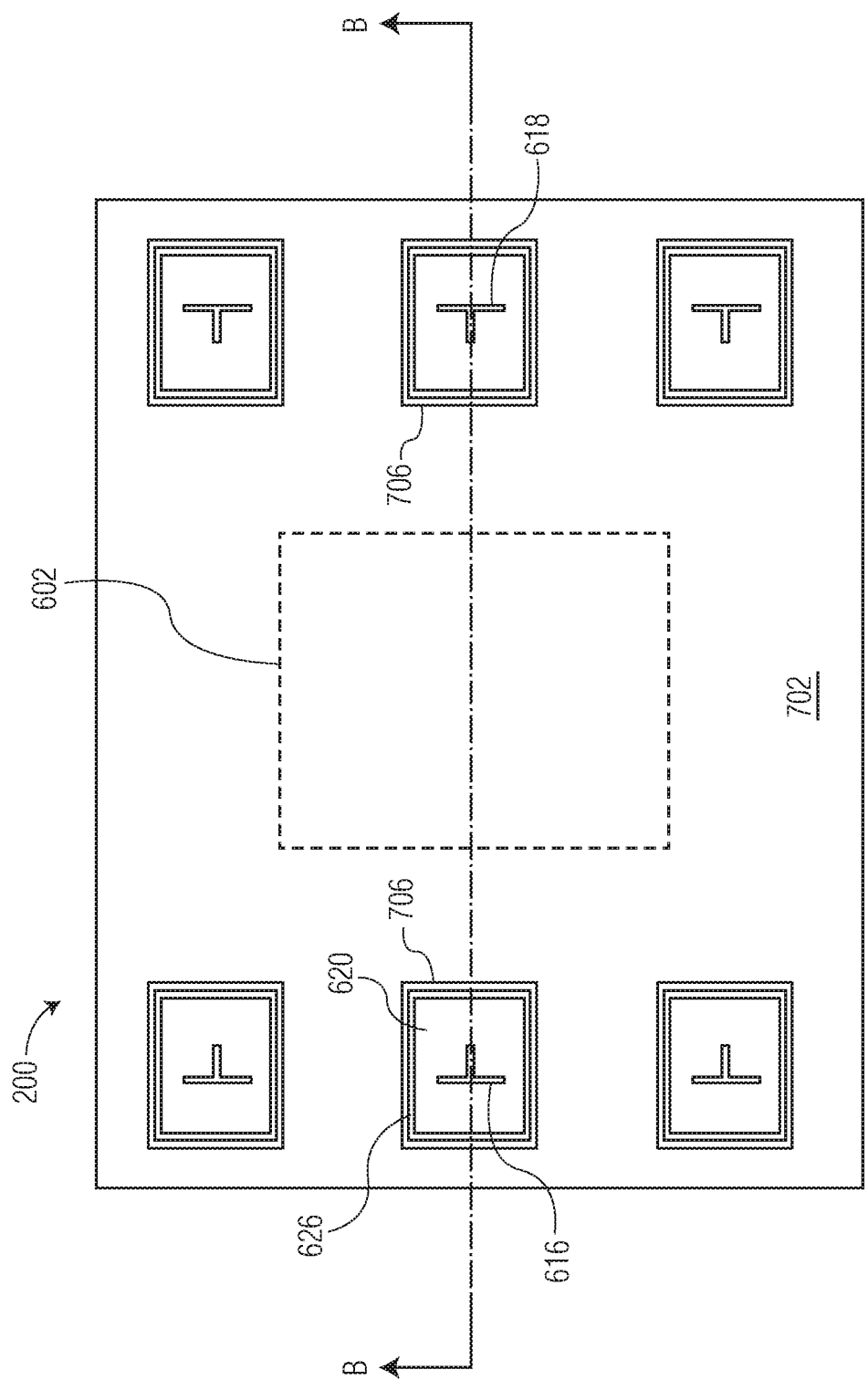
FIG. 8 illustrates, in a plan view, the example semiconductor device with waveguide at the stage of manufacture depicted in FIG. 7 in accordance with an embodiment.

FIG. 6 illustrates, in a simplified cross-sectional view, an example assembly of an example semiconductor device with waveguide 200 along line B-B of FIG. 8 at a stage of manufacture in accordance with an embodiment. At this stage of manufacture, the assembly 600 includes an encapsulant 638 at least partially encapsulating semiconductor die 602 and launcher structures 606 and 608 along with an RDL substrate 604 and ball connectors 644. Conductive feeds 640 and 642 are formed in the RDL substrate 604 between bond pads 610 and terminal pads 634 to interconnect semiconductor die 602 and antenna launchers 616 and 618 respectively. Conductive ball connectors 644 (e.g., solder balls) are affixed to a bottom surface of the RDL substrate 604. The ball connectors 644 are configured and arranged to provide conductive connections between the assembly 600 and a PCB, for example. Ball connectors 644 may be any suitable conductive structure such as solder balls, gold studs, copper pillars, and the like, to connect conductive features of the assembly 600 with the PCB. In this embodiment, the RDL substrate 604 is formed as a build-up substrate including a redistribution layer. In some embodiments, the RDL substrate 604 may be formed as a pre-formed substrate including a redistribution layer. In other embodiments, ball connectors 644 may be directly affixed to terminal pads 632-634 and bond pads 610 to provide connectivity with a PCB, for example, without utilizing an RDL substrate.

In this embodiment, the launcher structures 606 and 608 are each formed as a multilayer laminate structure having a cavity (e.g., cavities 612 and 614). For example, launcher structure 606 includes conductive layers 622 (e.g., metal or other conductive material layers) separated by a non-conductive material 620 (e.g., FR-4, ceramic). Contacts 624 and vias 625 provide conductive connections between terminal pads 632 at a bottom surface of launcher structure 606 and conductive layers 622. The cavity 612 includes an antenna launcher 616 and surrounding conductive pad 630 located at a bottom surface of the cavity 612. Likewise, the cavity 614 includes an antenna launcher 618 and surrounding conductive pad located at a bottom surface of the cavity 614. A conductive ring 626 is attached to the conductive pad 630 by way of a conductive connector 628 (e.g., solder, electrically conductive adhesive, anisotropic conductive film). A channel 636 is formed in the cavity 612 between outer sidewall of the conductive ring 626 and sidewall of cavity 612. The antenna launcher 616 is connected to terminal pad 634 at the bottom surface of launcher structure 606 by way of interconnecting contacts and via. In this embodiment, conductive layers 622 and interconnecting contacts 624 are configured and arranged to serve as a conductive wall or fence substantially surrounding the sidewall of cavity 612. In some embodiments, it may be desirable to connect the conductive wall or fence to a ground supply terminal or other supply terminal.

The semiconductor die 602 has an active surface (e.g., major surface having circuitry) and a backside surface (e.g., major surface opposite of the active surface). The semiconductor die 602 includes bond pads 610 at the active surface configured for connection to antenna launchers 616 and 618 by way of an RDL, for example. The semiconductor die 602 may be formed from any suitable semiconductor material, such as silicon, germanium, gallium arsenide, gallium nitride and the like. Semiconductor die 602 may further include any digital circuits, analog circuits, RF circuits, memory, signal processor, MEMS, sensors, the like, and combinations thereof.

Figure 7:
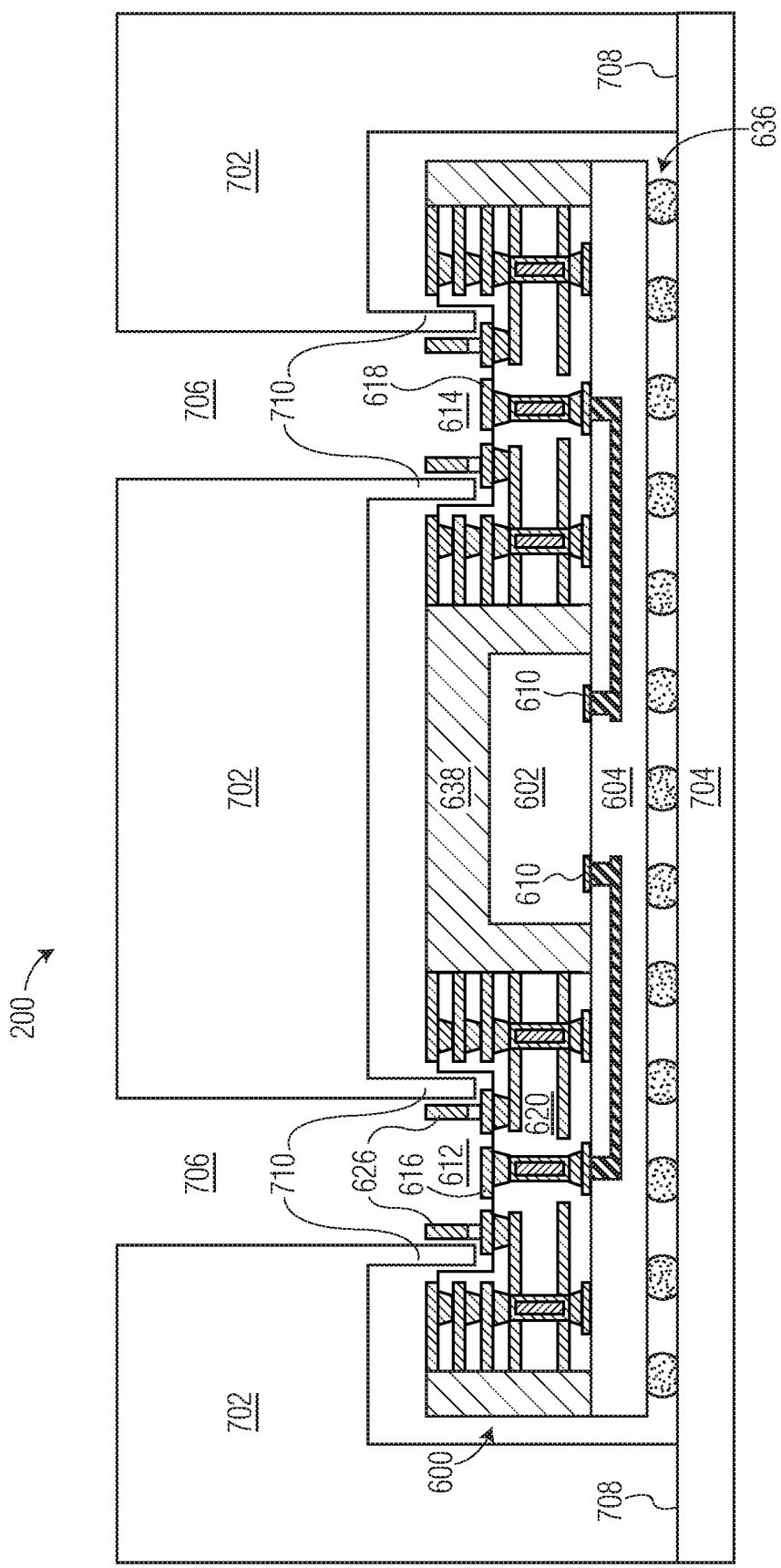

FIG. 7 illustrates, in a simplified cross-sectional view, the example semiconductor device 200 along line B-B of FIG. 8 at a stage of manufacture in accordance with an embodiment. At this stage of manufacture, the semiconductor device 200 includes the assembly 600 and overlapping waveguide structure 702 affixed to a common substrate 704. With the assembly 600 and overlapping waveguide structure 702 affixed to the substrate 704, the waveguide structure 702 is physically decoupled from the assembly 600. For example, the waveguide structure 702 does not physically contact the assembly 600. In this embodiment, substrate 704 may be characterized as a PCB or other multilayer substrate configured to provide connectivity with other components of a system, for example.

The waveguide structure 702 includes waveguides 706 (e.g., waveguide openings) and is attached to the substrate 704 at interface surfaces 708. The waveguide structure 702 may be attached to the substrate 704 at interface surfaces 708 using screws, alignment pins, adhesives, and combinations thereof, for example. In this embodiment, the waveguide structure 702 is formed from a conductive material such as a metal (e.g., aluminum, copper), other conductive materials, or combinations thereof. Waveguides 706 are formed as waveguide openings in the waveguide structure 702 with antenna launchers 616 and 618 exposed through the openings. In this embodiment, the waveguide openings 706 include sidewall portions 710 which extend downward into the channels 636 formed in the cavities 612 and 614 between outer sidewall of the conductive rings 626 and sidewall of cavities 612 and 614 respectively. Waveguides 706 dimensions (e.g., width, length) may be configured for propagation of signals (e.g., radar, mmWave signals, 30 GHz to 300 GHz) having desired wavelengths.

FIG. 8 illustrates, in a plan view, the example semiconductor device with waveguide 200 at the stage of manufacture depicted in FIG. 7 in accordance with an embodiment. At this stage of manufacture, the semiconductor device 200 includes the assembly (600) and overlapping waveguide structure 702 affixed to a common substrate (704). Underlying semiconductor die 602 is shown as dashed outline labeled 602 for reference. Cross-sectional views of semiconductor device with waveguide 200 taken along line B-B including waveguides 706 are shown in example stages of manufacture depicted in FIG. 7 and FIG. 8. Waveguides 706 are formed as waveguide openings in the waveguide structure 702 with antenna launchers 616 and 618, conductive rings 626, and non-conductive material 620 of launcher structures 606 and 608 exposed through the respective openings.

Figure 9:
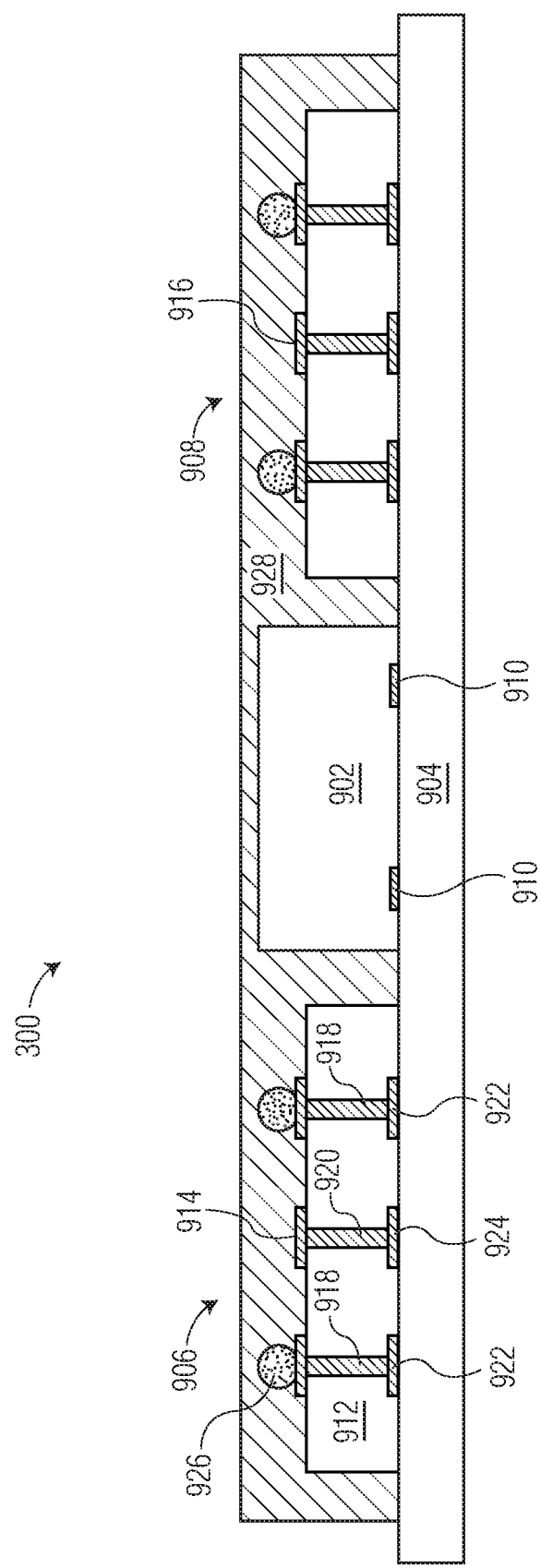
FIG. 9 through FIG. 11 illustrate, in a simplified cross-sectional view, an alternative example semiconductor device with waveguide along line C-C of FIG. 12 at stages of manufacture in accordance with an embodiment.
Figure 12:
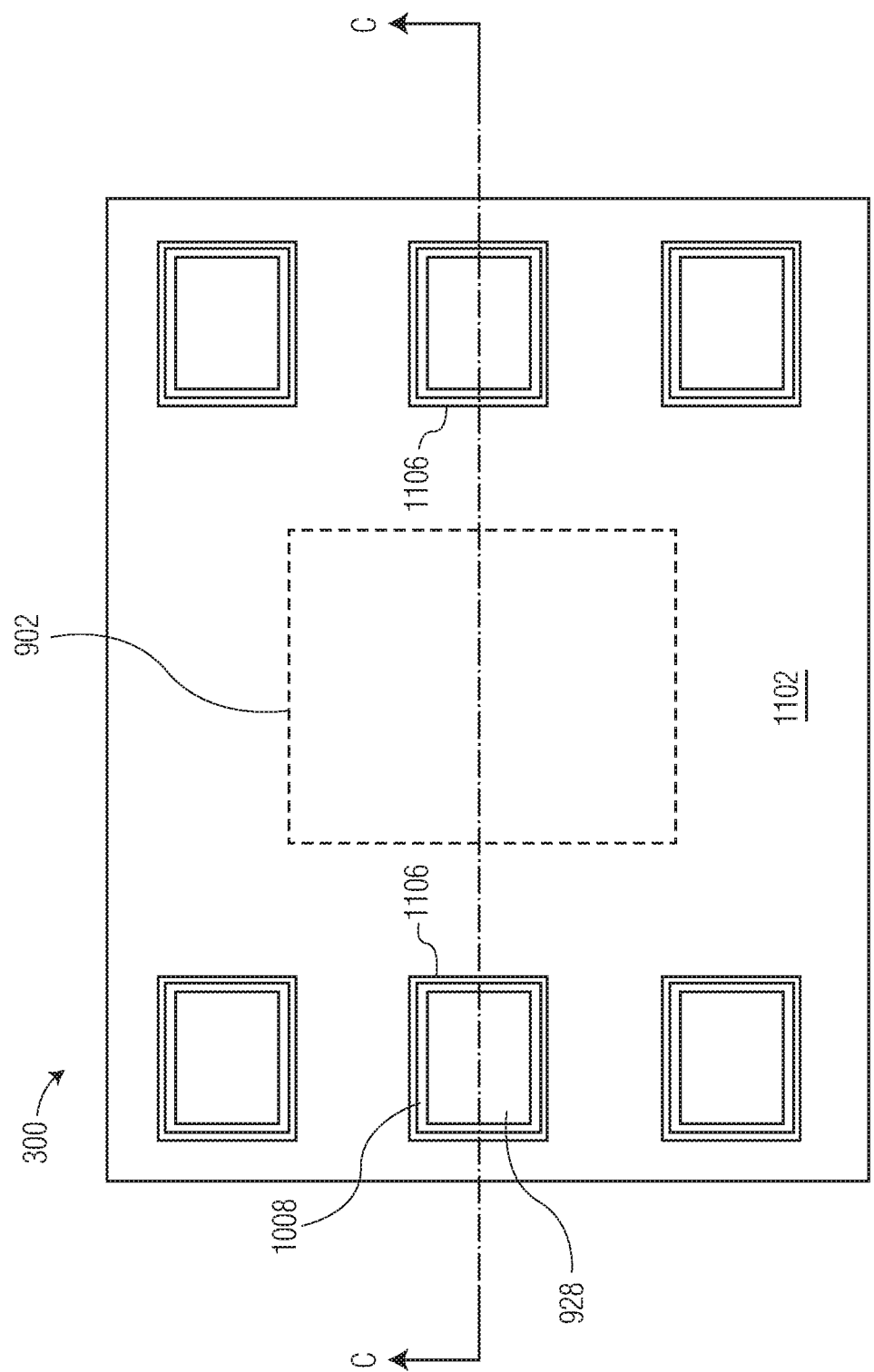
FIG. 12 illustrates, in a plan view, the example semiconductor device with waveguide at the stage of manufacture depicted in FIG. 11 in accordance with an embodiment.

FIG. 9 illustrates, in a simplified cross-sectional view, an example assembly of an example semiconductor device with waveguide 300 along line C-C of FIG. 12 at a stage of manufacture in accordance with an embodiment. At this stage of manufacture, the assembly of semiconductor device 300 includes an encapsulant (e.g., epoxy material) 928 encapsulating semiconductor die 902 and launcher structures 906 and 908 placed on the carrier substrate 904. In this embodiment, the semiconductor die 902 and launcher structures 906 and 908 are over-molded with an epoxy material encapsulant.

In this embodiment, the launcher structures 906 and 908 are formed as laminate structures having antenna launcher 914 and 916 located at a top surface of launcher structures 906 and 908 respectively. For example, the launcher structure 906 includes conductive interconnects 918 and 920 (e.g., metal or other conductive materials) separated by a non-conductive material 912 (e.g., FR-4, ceramic). Conductive interconnect 918 provides conductive connections between terminal pads 922 at a bottom surface of launcher structure 906 and conductive ball connectors 926 (e.g., solder balls). The antenna launcher 914 is connected to terminal pad 924 at the bottom surface of launcher structure 906 by way of conductive interconnect 920. Conductive interconnect 918 and conductive ball connectors 926 are configured and arranged to substantially surround antennal launcher 914 and conductive interconnect 920.

The semiconductor die 902 has an active surface (e.g., major surface having circuitry) and a backside surface (e.g., major surface opposite of the active surface). The semiconductor die 902 includes bond pads 910 at the active surface configured for connection to antenna launchers 914 and 916 by way of an RDL, for example. The semiconductor die 902 may be formed from any suitable semiconductor material, such as silicon, germanium, gallium arsenide, gallium nitride and the like. Semiconductor die 902 may further include any digital circuits, analog circuits, RF circuits, memory, signal processor, MEMS, sensors, the like, and combinations thereof.

Figure 10:
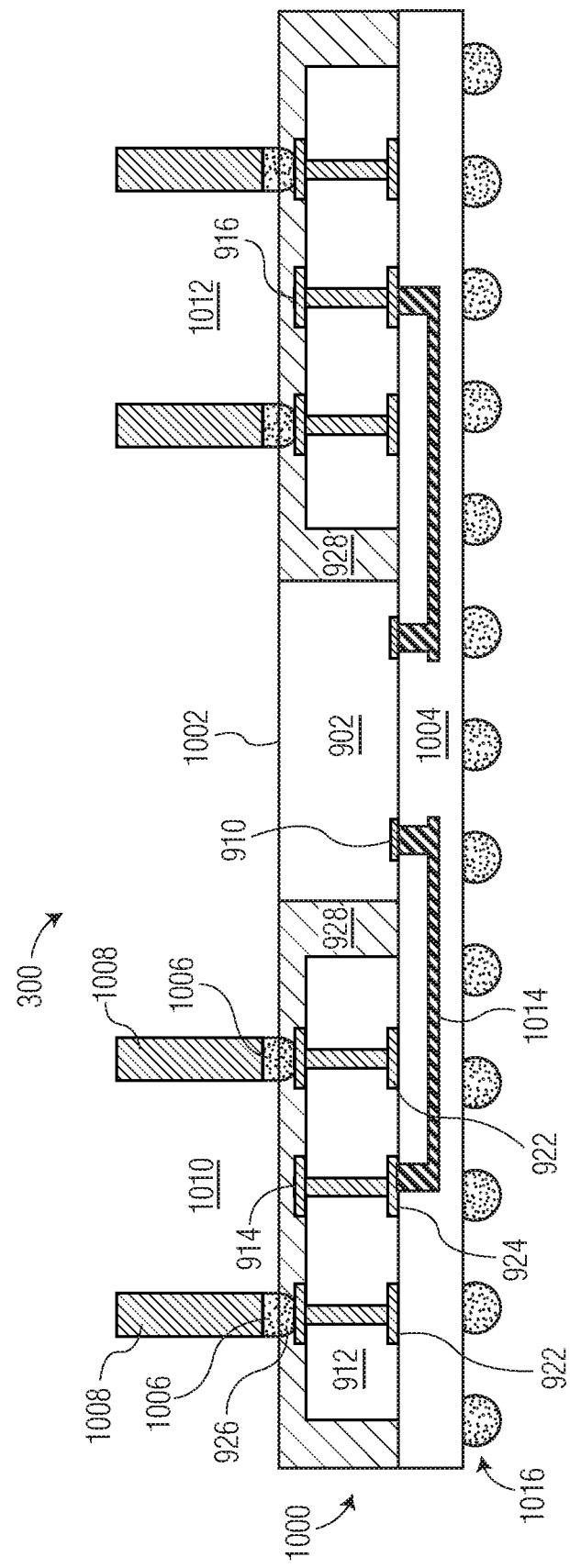

FIG. 10 illustrates, in a simplified cross-sectional view, the example assembly at a subsequent stage of manufacture in accordance with an embodiment. At this stage of manufacture, the assembly 1000 includes the encapsulant 928 at least partially encapsulating semiconductor die 902 and launcher structures 906 and 908 along with an RDL substrate 1004 and ball connectors 1016.

In this embodiment, a backside grind operation is performed on the assembly 1000 to expose portions of ball connectors 926 of launcher structures 906 and 908 and a backside surface of semiconductor die 902. A conductive ring 1008 is attached to a conductive path formed by the exposed a portions of ball connectors 926 by way of a conductive connector 1006 (e.g., solder, electrically conductive adhesive, anisotropic conductive film). The conductive ring 1008 is configured and arranged to serve as a conductive wall or fence substantially surrounding the antenna launcher 914 and forming a cavity 1010. Likewise, a conductive ring substantially surrounds the antenna launcher 916 and forms a cavity 1012. In some embodiments, it may be desirable to connect the conductive walls or fences to a ground supply terminal or other supply terminal.

After the carrier substrate 904 is removed, the RDL substrate 1004 is applied to the resulting exposed bottom surface including an exposed active surface of the semiconductor die 902 and exposed bottom surfaces of the launcher structures 906 and 908. Conductive feeds 1014 are formed in the RDL substrate 1004 between bond pads 910 and terminal pads 924 to interconnect semiconductor die 902 and antenna launchers 914 and 916 respectively. After the RDL substrate 1004 is applied, conductive ball connectors 1016 (e.g., solder balls) are affixed to a bottom surface of the RDL substrate 1004. The ball connectors 1016 are configured and arranged to provide conductive connections between the assembly 1000 and a printed circuit board (PCB), for example. Ball connectors 1016 may be any suitable conductive structure such as solder ball, gold studs, copper pillars, and the like, to connect conductive features of the assembly 1000 with the PCB. In this embodiment, the RDL substrate 1004 is formed as a build-up substrate including a redistribution layer. In some embodiments, the RDL substrate 1004 may be formed as a pre-formed substrate including a redistribution layer. In other embodiments, ball connectors 1016 may be directly affixed to terminal pads 922, 924 and bond pads 910 to provide connectivity with a PCB, for example, without utilizing an RDL substrate.

Figure 11:
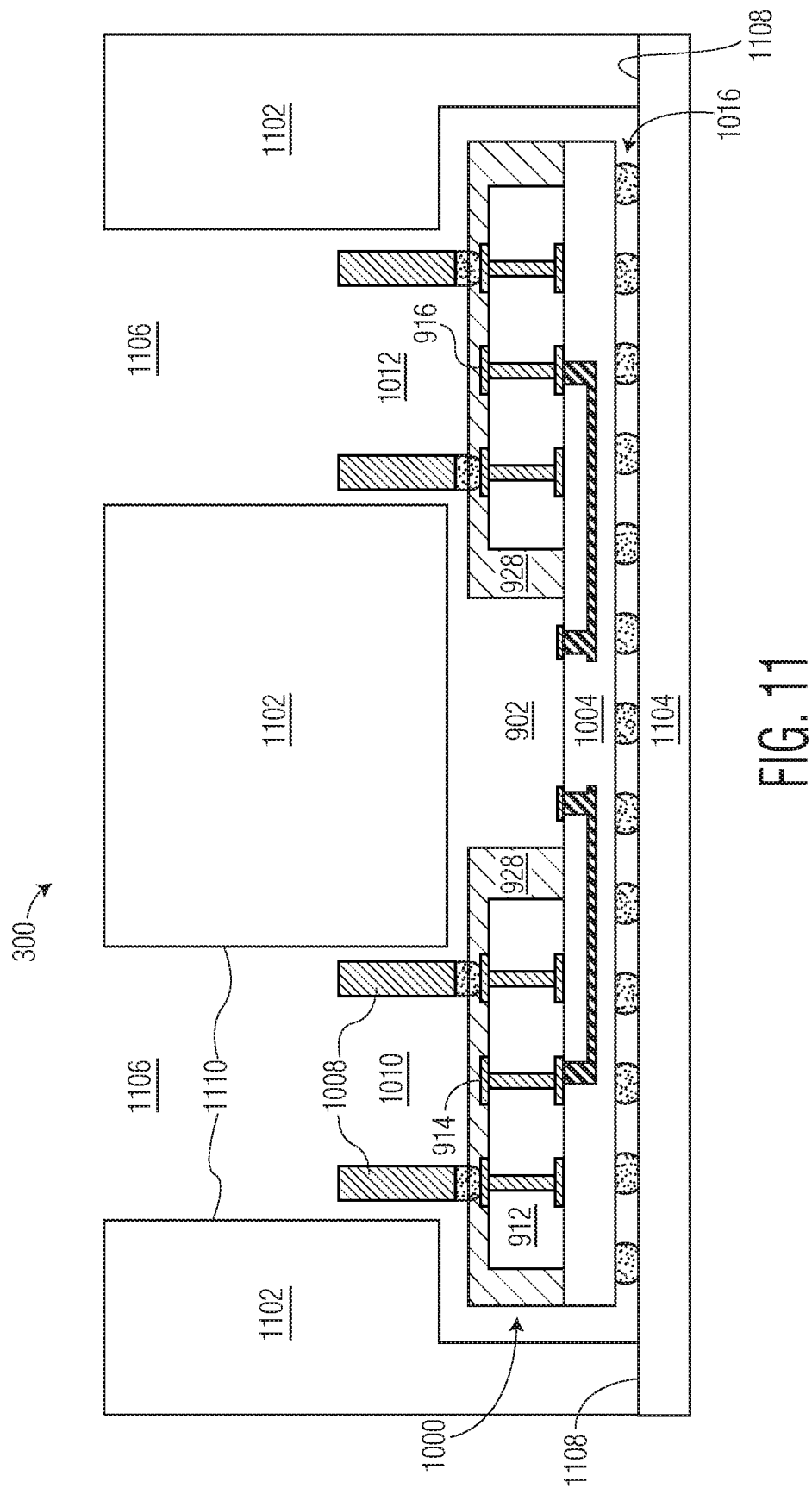

FIG. 11 illustrates, in a simplified cross-sectional view, the example semiconductor device with waveguide 300 along line C-C of FIG. 12 at a stage of manufacture in accordance with an embodiment. At this stage of manufacture, the semiconductor device with waveguide 300 includes the assembly 1000 and overlapping waveguide structure 1102 affixed to a common substrate 1104. With the assembly 1000 and overlapping waveguide structure 1102 affixed to the substrate 1104, the waveguide structure 1102 is physically decoupled from the assembly 1000. For example, the waveguide structure 1102 does not physically contact the assembly 1000. In this embodiment, substrate 1104 may be characterized as a PCB or other multilayer substrate configured to provide connectivity with other components of a system, for example.

The waveguide structure 1102 includes waveguides 1106 (e.g., waveguide openings) and is attached to the substrate 1104 at interface surfaces 1108. The waveguide structure 1102 may be attached to the substrate 1104 at interface surfaces 1108 using screws, alignment pins, adhesives, and combinations thereof, for example. In this embodiment, the waveguide structure 1102 is formed from a conductive material such as a metal (e.g., aluminum, copper), other conductive materials, or combinations thereof. Waveguides 1106 are formed as waveguide openings in the waveguide structure 1102 with conductive rings 1008 and a surface of encapsulant 928 over antenna launchers 914 and 916 exposed through the openings. In this embodiment, the waveguide openings 1106 are configured and arranged to substantially surround the conductive rings substantially surrounding antenna launchers 914 and 916. For example, waveguide 1106 include sidewalls 1110 which surround outer sidewalls of the conductive ring 1008. Waveguides 1106 dimensions (e.g., width, length) may be configured for propagation of signals (e.g., radar, mmWave signals, 30 GHz to 300 GHz) having desired wavelengths.

FIG. 12 illustrates, in a plan view, the example semiconductor device with waveguide 300 at the stage of manufacture depicted in FIG. 11 in accordance with an embodiment. At this stage of manufacture, the semiconductor device 300 includes the assembly (1000) and overlapping waveguide structure 1102 affixed to a common substrate (1104). Underlying semiconductor die 902 is shown as dashed outline labeled 902 for reference. Cross-sectional views of semiconductor device 300 taken along line C-C including waveguides 1106 are shown in example stages of manufacture depicted in FIG. 9 through FIG. 11. Waveguides 1106 are formed as waveguide openings in the waveguide structure 1102 with conductive rings 1008 and encapsulant 928 over antenna launchers (914 and 916) exposed through the respective openings.

Figure 13:
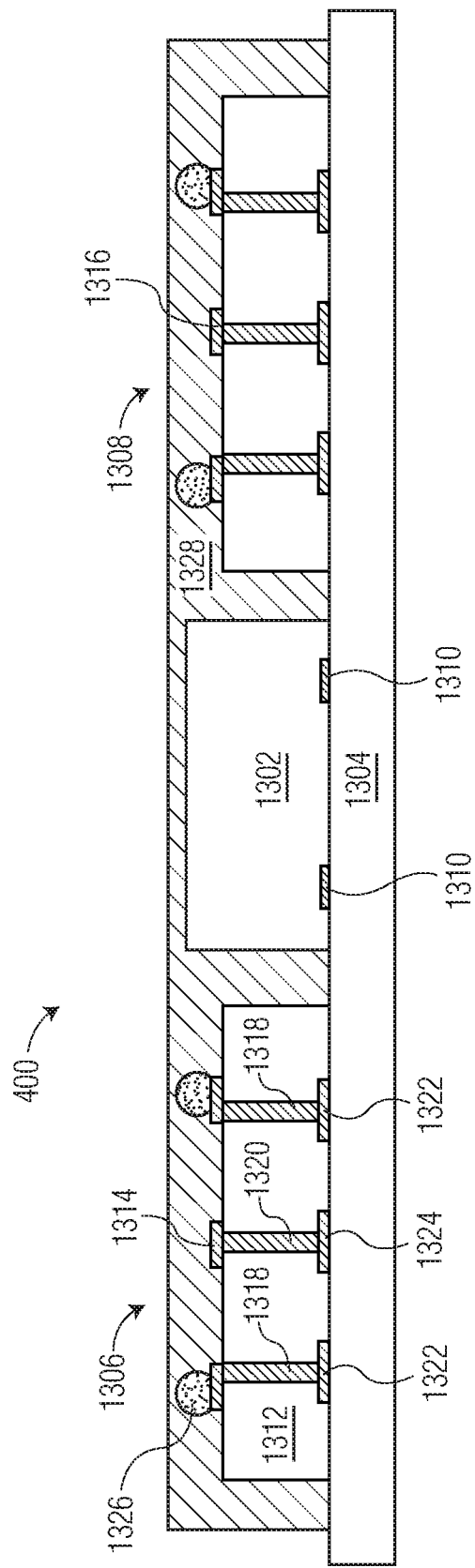
FIG. 13 through FIG. 15 illustrate, in a simplified cross-sectional view, an alternative example semiconductor device with waveguide along line D-D of FIG. 16 at stages of manufacture in accordance with an embodiment.
Figure 16:
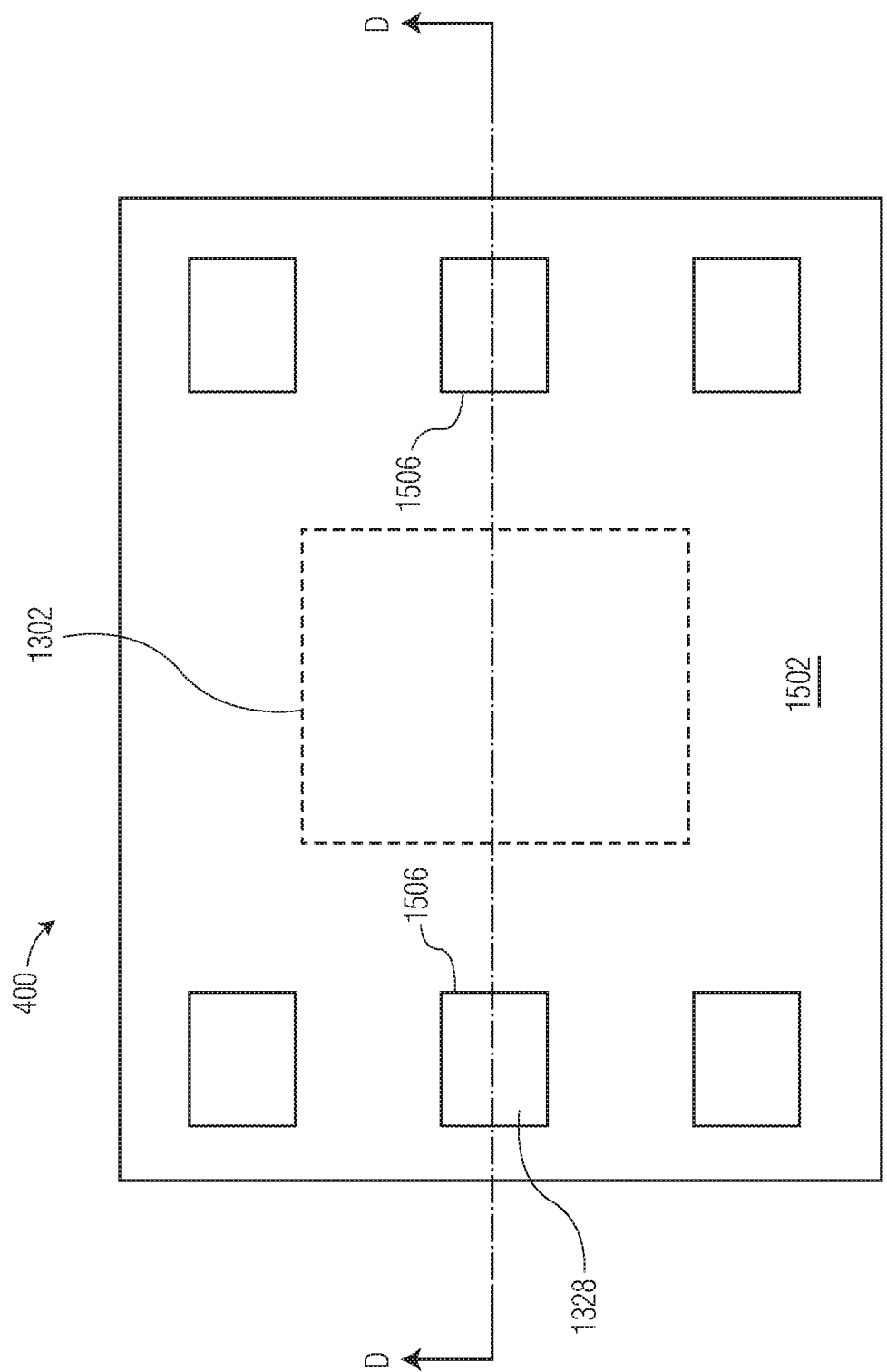
FIG. 16 illustrates, in a plan view, the example semiconductor device with waveguide at the stage of manufacture depicted in FIG. 15 in accordance with an embodiment.

FIG. 13 illustrates, in a simplified cross-sectional view, an example assembly of an example semiconductor device with waveguide 400 along line D-D of FIG. 16 at a stage of manufacture in accordance with an embodiment. At this stage of manufacture, the assembly of semiconductor device 400 includes an encapsulant (e.g., epoxy material) 1328 encapsulating semiconductor die 1302 and launcher structures 1306 and 1308 placed on the carrier substrate 1304. In this embodiment, the semiconductor die 1302 and launcher structures 1306 and 1308 are over-molded with an epoxy material encapsulant.

In this embodiment, the launcher structures 1306 and 1308 are formed as laminate structures having antenna launcher 1314 and 1316 located at a top surface of launcher structures 1306 and 1308 respectively. For example, the launcher structure 1306 includes conductive interconnects 1318 and 1320 (e.g., metal or other conductive materials) separated by a non-conductive material 1312 (e.g., FR-4, ceramic). Conductive interconnect 1318 provides conductive connections between terminal pads 1322 at a bottom surface of launcher structure 1306 and conductive ball connectors 1326 (e.g., solder balls). The antenna launcher 1314 is connected to terminal pad 1324 at the bottom surface of launcher structure 1306 by way of conductive interconnect 1320. Conductive interconnect 1318 and conductive ball connectors 1326 are configured and arranged to substantially surround antennal launcher 1314 and conductive interconnect 1320.

The semiconductor die 1302 has an active surface (e.g., major surface having circuitry) and a backside surface (e.g., major surface opposite of the active surface). The semiconductor die 1302 includes bond pads 1310 at the active surface configured for connection to antenna launchers 1314 and 1316 by way of an RDL, for example. The semiconductor die 1302 may be formed from any suitable semiconductor material, such as silicon, germanium, gallium arsenide, gallium nitride and the like. Semiconductor die 1302 may further include any digital circuits, analog circuits, RF circuits, memory, signal processor, MEMS, sensors, the like, and combinations thereof.

Figure 14:
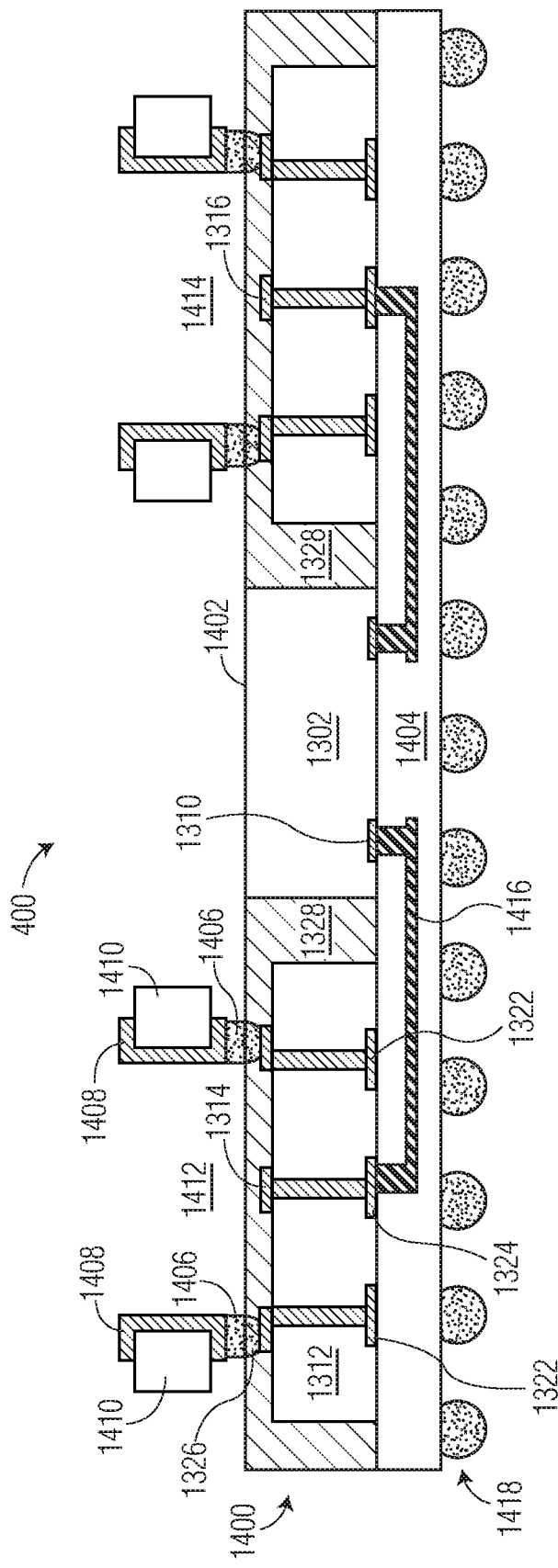

FIG. 14 illustrates, in a simplified cross-sectional view, the example assembly at a subsequent stage of manufacture in accordance with an embodiment. At this stage of manufacture, the assembly 1400 includes the encapsulant 1328 at least partially encapsulating semiconductor die 1302 and launcher structures 1306 and 1308 along with an RDL substrate 1404 and ball connectors 1418.

In this embodiment, a backside grind operation is performed on the assembly 1400 to expose portions of ball connectors 1326 launcher structures 1306 and 1308 and a backside surface of semiconductor die 1302. A conductive ring 1408 is formed as a conductive layer (e.g., metal or other conductive material) on sidewalls of an opening in a non-conductive substrate 1410. The conductive ring 1408 is attached to the exposed a portions of ball connectors 1326 by way of a conductive connector 1406 (e.g., solder, electrically conductive adhesive, anisotropic conductive film). The conductive ring 1408 is configured and arranged to serve as a conductive wall or fence substantially surrounding the antenna launcher 1314 and forming a cavity 1412. Likewise, a conductive ring substantially surrounds the antenna launcher 1316 and forms a cavity 1414. In some embodiments, it may be desirable to connect the conductive walls or fences to a ground supply terminal or other supply terminal.

After the carrier substrate 1304 is removed, the RDL substrate 1404 is applied to the resulting exposed bottom surface including an exposed active surface of the semiconductor die 1302 and exposed bottom surfaces of the launcher structures 1306 and 1308. Conductive feeds 1416 are formed in the RDL substrate 1404 between bond pads 1310 and terminal pads 1324 to interconnect semiconductor die 1302 and antenna launchers 1314 and 1316 respectively. After the RDL substrate 1404 is applied, conductive ball connectors 1418 (e.g., solder balls) are affixed to a bottom surface of the RDL substrate 1404. The ball connectors 1418 are configured and arranged to provide conductive connections between the assembly 1400 and a printed circuit board (PCB), for example. Ball connectors 1418 may be any suitable conductive structure such as solder ball, gold studs, copper pillars, and the like, to connect conductive features of the assembly 1400 with the PCB. In this embodiment, the RDL substrate 1404 is formed as a build-up substrate including a redistribution layer. In some embodiments, the RDL substrate 1404 may be formed as a pre-formed substrate including a redistribution layer. In other embodiments, ball connectors 1418 may be directly affixed to terminal pads 1322, 1324 and bond pads 1310 to provide connectivity with a PCB, for example, without utilizing an RDL substrate.

Figure 15:
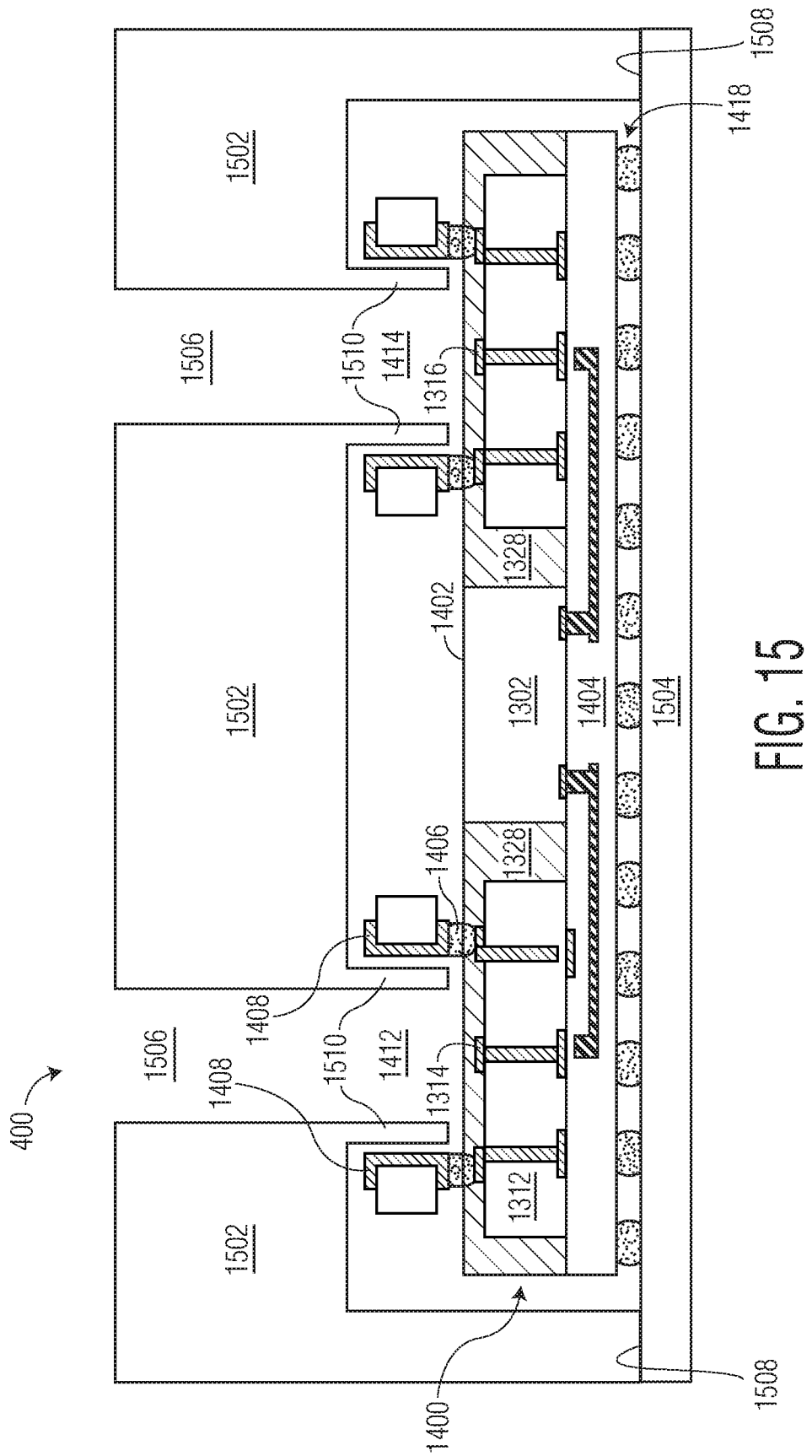

FIG. 15 illustrates, in a simplified cross-sectional view, the example semiconductor device with waveguide 400 along line D-D of FIG. 16 at a stage of manufacture in accordance with an embodiment. At this stage of manufacture, the semiconductor device with waveguide 400 includes the assembly 1400 and overlapping waveguide structure 1502 affixed to a common substrate 1504. With the assembly 1400 and overlapping waveguide structure 1502 affixed to the substrate 1504, the waveguide structure 1502 is physically decoupled from the assembly 1400. For example, the waveguide structure 1502 does not physically contact the assembly 1400. In this embodiment, substrate 1504 may be characterized as a PCB or other multilayer substrate configured to provide connectivity with other components of a system, for example.

The waveguide structure 1502 includes waveguides 1506 (e.g., waveguide openings) and is attached to the substrate 1504 at interface surfaces 1508. The waveguide structure 1502 may be attached to the substrate 1504 at interface surfaces 1508 using screws, alignment pins, adhesives, and combinations thereof, for example. In this embodiment, the waveguide structure 1502 is formed from a conductive material such as a metal (e.g., aluminum, copper), other conductive materials, or combinations thereof. Waveguides 1506 are formed as waveguide openings in the waveguide structure 1502 with a surface of encapsulant 1328 over antenna launchers 1314 and 1316 exposed through the openings. In this embodiment, the waveguide openings 1506 include sidewall portions 1510 which extend downward into the cavities 1412 and 1414 and substantially surrounding the antenna launchers 1314 and 1316 respectively. Waveguides 1506 dimensions (e.g., width, length) may be configured for propagation of signals (e.g., radar, mmWave signals, 30 GHz to 300 GHz) having desired wavelengths.

FIG. 16 illustrates, in a plan view, the example semiconductor device with waveguide 400 at the stage of manufacture depicted in FIG. 15 in accordance with an embodiment. At this stage of manufacture, the semiconductor device with waveguide 400 includes the assembly (1400) and overlapping waveguide structure 1502 affixed to a common substrate (1404). Underlying semiconductor die 1302 is shown as dashed outline labeled 1302 for reference. Cross-sectional views of semiconductor device with waveguide 400 taken along line D-D including waveguides 1506 are shown in example stages of manufacture depicted in FIG. 13 through FIG. 15. Waveguides 1506 are formed as waveguide openings in the waveguide structure 1502 with encapsulant 1328 over antenna launchers (1314 and 1316) exposed through the respective openings.

Generally, there is provided, a method of manufacturing a manufacturing a semiconductor device, the method including forming an assembly including placing a semiconductor die and a launcher structure on a carrier substrate, the launcher structure including an antenna launcher; encapsulating at least a portion of the semiconductor die and the launcher structure; applying a redistribution layer on a first major surface of the semiconductor die and a first major surface of the launcher structure, a bond pad of the semiconductor die connected by way of the redistribution layer to the antenna launcher; attaching the assembly to a substrate; and attaching a waveguide structure to the substrate, the waveguide structure overlapping the assembly and physically decoupled from the assembly. The launcher structure may be formed having a cavity, the antenna launcher located at a bottom surface of the cavity. The attaching the waveguide structure to the substrate may further include extending sidewalls of an opening in the waveguide structure into the cavity to substantially surround the antenna launcher. The dimensions of the opening in the waveguide structure may be configured for propagation of a mmWave signal. The method may further include forming a conductive ring structure substantially surround the antenna launcher, outer sidewalls of the conductive ring structure spaced from sidewalls of the cavity to form a channel between the conductive ring structure and sidewalls of the cavity. The attaching the waveguide structure to the substrate may further include extending sidewalls of an opening in the waveguide structure into the channel formed between the conductive ring structure and the sidewalls of the cavity. The method may further include back-grinding the assembly to expose a conductive path substantially surrounding the antenna launcher; and attaching a conductive ring structure onto the exposed conductive path. The attaching the waveguide structure to the substrate may further include extending sidewalls of an opening in the waveguide structure to substantially surround the conductive ring structure. The attaching the waveguide structure to the substrate may further include extending sidewalls of an opening in the waveguide structure to substantially surround the antenna launcher, the conductive ring structure surrounding the extended sidewall of the opening.

In another embodiment, there is provided, a semiconductor device including a printed circuit board (PCB) having a topside surface; a packaged assembly attached to the PCB at the topside surface, the packaged assembly including a package substrate having a first major surface and a second major surface; a semiconductor die having an active surface and a backside surface, the semiconductor die attached to the package substrate at the first major surface; a launcher structure attached to the package substrate at the first major surface, the launcher structure including an antenna launcher coupled to the semiconductor die by way of the package substrate; and an epoxy material encapsulating at least a portion of the semiconductor die and the launcher structure;

and a waveguide structure attached to the PCB at the topside surface, the waveguide structure overlapping the packaged assembly and physically decoupled from the packaged assembly. The package substrate may be characterized as a build-up substrate including a redistribution layer configured to couple a bond pad on the active surface of the semiconductor die with the antenna launcher. The waveguide structure may be configured and arranged for propagation of a mmWave signal. The launcher structure may be formed having a cavity, the antenna launcher located at a bottom surface of the cavity. The waveguide structure may include a waveguide opening having sidewall portions extended into the cavity and substantially surrounding the antenna launcher. The launcher structure may further include a conductive ring structure substantially surrounding the antenna launcher, outer sidewalls of the conductive ring structure spaced from sidewalls of the cavity to form a channel between the conductive ring structure and sidewalls of the cavity. The waveguide structure may include a waveguide opening having sidewall portions extended into the channel formed between the conductive ring structure and the sidewalls of the cavity.

In yet another embodiment, there is provided, a semiconductor device including a printed circuit board (PCB) having a topside surface; a packaged semiconductor device attached to the PCB at the topside surface, the packaged semiconductor device including a package substrate having a first major surface and a second major surface; a semiconductor die having an active surface and a backside surface, the semiconductor die attached to the package substrate at the first major surface; a launcher structure attached to the package substrate at the first major surface, the launcher structure including an antenna launcher coupled to the semiconductor die by way a conductive feed of the package substrate; and an epoxy material encapsulating at least a portion of the semiconductor die and the launcher structure; and a waveguide structure attached to the PCB at the topside surface, the waveguide structure overlapping the packaged semiconductor device, a waveguide opening of the waveguide structure having sidewalls substantially surrounding the antenna launcher, the waveguide structure physically decoupled from the packaged semiconductor device. The launcher structure may be formed having a cavity, the antenna launcher located at a bottom surface of the cavity. The sidewall portions of the waveguide opening may extend into the cavity and substantially surround the antenna launcher. The launcher structure may further include a conductive ring structure substantially surrounding the antenna launcher and spaced from sidewalls of the cavity to form a channel between the conductive ring structure and sidewalls of the cavity, sidewall portions of the waveguide opening extend into the channel formed between the conductive ring structure and the sidewalls of the cavity.

By now, it should be appreciated that there has been provided a semiconductor device including a packaged assembly with overlapping waveguide structure affixed to a common substrate. The waveguide structure is physically decoupled from the packaged assembly. A semiconductor die and launcher structure are encapsulated on a package substrate to form the packaged assembly. The waveguide structure includes a waveguide opening over an antenna launcher of the launcher structure allowing propagation of radio frequency (RF) signals. By having the overlapping waveguide structure physically decoupled from the packaged assembly, package stress is reduced and reliability is improved while providing low loss RF signal performance in a compact footprint.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    a printed circuit board (PCB) having a topside surface;
    a packaged assembly attached to the PCB at the topside surface, the packaged assembly comprising:
        a package substrate having a first major surface and a second major surface;
        a semiconductor die having an active surface and a backside surface, the semiconductor die attached to the package substrate at the first major surface;
        a launcher structure attached to the package substrate at the first major surface, the launcher structure including an antenna launcher coupled to the semiconductor die by way of the package substrate; and
        an epoxy material encapsulating at least a portion of the semiconductor die and the launcher structure; and
    a waveguide structure attached to the PCB at the topside surface, the waveguide structure overlapping the packaged assembly and physically decoupled from the packaged assembly.

2. The semiconductor device of claim 1, wherein the package substrate is characterized as a build-up substrate comprising a redistribution layer configured to couple a bond pad on the active surface of the semiconductor die with the antenna launcher.

3. The semiconductor device of claim 1, wherein the waveguide structure is configured and arranged for propagation of a mmWave signal.

4. The semiconductor device of claim 1, wherein the launcher structure is formed having a cavity, the antenna launcher located at a bottom surface of the cavity.

5. The semiconductor device of claim 4, wherein the waveguide structure includes a waveguide opening having sidewall portions extended into the cavity and substantially surrounding the antenna launcher.

6. The semiconductor device of claim 4, wherein the launcher structure further includes a conductive ring structure substantially surrounding the antenna launcher, outer sidewalls of the conductive ring structure spaced from sidewalls of the cavity to form a channel between the conductive ring structure and sidewalls of the cavity.

7. The semiconductor device of claim 6, wherein the waveguide structure includes a waveguide opening having sidewall portions extended into the channel formed between the conductive ring structure and the sidewalls of the cavity.

8. A semiconductor device comprising:
a printed circuit board (PCB) having a topside surface;
a packaged semiconductor device attached to the PCB at the topside surface, the packaged semiconductor device comprising:
  a package substrate having a first major surface and a second major surface;
  a semiconductor die having an active surface and a backside surface, the semiconductor die attached to the package substrate at the first major surface;
  a launcher structure attached to the package substrate at the first major surface, the launcher structure including an antenna launcher coupled to the semiconductor die by way a conductive feed of the package substrate; and
  an epoxy material encapsulating at least a portion of the semiconductor die and the launcher structure; and
a waveguide structure attached to the PCB at the topside surface, the waveguide structure overlapping the packaged semiconductor device, a waveguide opening of the waveguide structure having sidewalls substantially surrounding the antenna launcher, the waveguide structure physically decoupled from the packaged semiconductor device.

9. The semiconductor device of claim 8, wherein the launcher structure is formed having a cavity, the antenna launcher located at a bottom surface of the cavity.

10. The semiconductor device of claim 9, wherein sidewall portions of the waveguide opening extend into the cavity and substantially surround the antenna launcher.

11. The semiconductor device of claim 9, wherein the launcher structure further includes a conductive ring structure substantially surrounding the antenna launcher and spaced from sidewalls of the cavity to form a channel between the conductive ring structure and sidewalls of the cavity, sidewall portions of the waveguide opening extend into the channel formed between the conductive ring structure and the sidewalls of the cavity.

* * * * *